United States Patent
Botte

(10) Patent No.: US 10,544,503 B2
(45) Date of Patent: Jan. 28, 2020

(54) METHOD OF PRODUCING GRAPHENE

(71) Applicant: Ohio University, Athens, OH (US)

(72) Inventor: Gerardine G. Botte, Athens, OH (US)

(73) Assignee: Ohio University, Athens, OH (US)

(*) Notice: Subject to any disclaimer, the term of this patent is extended or adjusted under 35 U.S.C. 154(b) by 253 days.

(21) Appl. No.: 14/391,253

(22) PCT Filed: Apr. 8, 2013

(86) PCT No.: PCT/US2013/035627
§ 371 (c)(1),
(2) Date: Oct. 8, 2014

(87) PCT Pub. No.: WO2013/154997
PCT Pub. Date: Oct. 17, 2013

(65) Prior Publication Data
US 2015/0125604 A1    May 7, 2015

Related U.S. Application Data

(60) Provisional application No. 61/621,625, filed on Apr. 9, 2012.

(51) Int. Cl.
*C23C 16/00* (2006.01)
*C23C 16/26* (2006.01)
(Continued)

(52) U.S. Cl.
CPC .............. *C23C 16/26* (2013.01); *B82Y 30/00* (2013.01); *B82Y 40/00* (2013.01); *C23C 16/455* (2013.01); *C23C 16/46* (2013.01); *C23C 16/463* (2013.01)

(58) Field of Classification Search
CPC ..... C23C 16/455; C23C 16/26; C23C 16/463; C23C 16/46; C01B 31/0446; C01B 31/0453; B82Y 40/00; B82Y 30/00
(Continued)

(56) References Cited

U.S. PATENT DOCUMENTS

2007/0003471 A1* 1/2007 Kawabata .............. B82Y 30/00
423/447.3
2012/0058352 A1* 3/2012 Shah .................... C23C 16/0272
428/457

FOREIGN PATENT DOCUMENTS

WO    2010111129 A1    9/2010
WO    WO 2010111129 A1 *  9/2010 ............. B82Y 30/00

OTHER PUBLICATIONS

"Versatile Catalytic System for the Large-Scale and Controlled Synthesis of Single-Wall, Double-Wall, Multi-Wall, and Graphene Carbon Nanostructures", Dervishi et al, Chem. Mater. 2009, 21, 5491-5498, online Oct. 20, 2009.*

(Continued)

*Primary Examiner* — Michael P Wieczorek
*Assistant Examiner* — Michael G Miller
(74) *Attorney, Agent, or Firm* — Wood Herron & Evans LLP

(57) ABSTRACT

Graphene can be produced from the byproducts formed during electrolysis of coal. These byproducts may be electrolyzed coal particles, gelatinous film formed on the electrolyzed coal particles, or the electrolyzed coal particles together with the gelatinous film. The electrolyzed coal byproduct is deposited as a thin layer onto a surface, or carrier substrate 50, which is heated to a temperature effective to form graphite while a reductant gas, such as hydrogen, flows over the heated coal product. The reductant gas flow carries the carbon particles and deposits them onto a surface 66, forming a layer of graphene thereon.

20 Claims, 3 Drawing Sheets

(51) Int. Cl.
 *B82Y 30/00* (2011.01)
 *B82Y 40/00* (2011.01)
 *C23C 16/455* (2006.01)
 *C23C 16/46* (2006.01)

(58) Field of Classification Search
 USPC .................................................. 427/249.1
 See application file for complete search history.

(56) References Cited

OTHER PUBLICATIONS

"Characterization of electrooxidized Pittsburgh No. 8 Coal", Yolanda De Abreu et al, Fuel 86 (2007) 573-584, accessed online at http://www.sciencedirect.com/science/article/pii/S001623610600322X on Feb. 17, 2017.*

"Coal-derived carbon nanotubes by thermal plasma jet" (Tian et al, Carbon 42 (2004) 2597-2601, available online Jul. 3, 2004, accessed online Oct. 26, 2017).*

International Preliminary Report on Patentability in International Patent Application No. PCT/US2013/035627, dated Oct. 23, 2014, 7 pgs.

Dervishi, E. et al., "Versatile Catalytic System for the Large-Scale and Controlled Synthesis of Single-Wall, Double-Wall, Multi-Wall, and Graphene Carbon Nanostructures," Chem. Mater. (2009) 21:5491-5498.

International Search Report and Written Opinion in International Patent Application No. PCT/US2013/035627, dated Jul. 23, 2013, 10 pgs.

Jin, X. et al., "Understanding the kinetics of coal electrolysis at intermediate temperatures," Journal of Power Sources (2010) 195:4935-4942.

Office Action in corresponding Chinese Patent Application No. 201380029133.5 dated Sep. 6, 2015, 6 pgs.

Office Action in corresponding Australian Patent Application No. 2013246213 dated Oct. 29, 2015, 2 pgs.

* cited by examiner

METHOD OF PRODUCING GRAPHENE

CROSS REFERENCE TO RELATED APPLICATION

Pursuant to 37 CFR § 1.78(a)(4), this application claims priority to and the benefit of International Patent Application No. PCT/US2013/035627, filed Apr. 8, 2013, which claims priority to and the benefit of U.S. Patent Application No. 61/621,625, filed Apr. 9, 2012, both of which are expressly incorporated herein by reference in their entireties.

BACKGROUND OF THE INVENTION

Graphene, a two dimensional monolayer of $sp^2$-hybridized carbon atoms arranged in a honeycomb network, exhibits excellent mechanical, thermal, electrical, and optical properties; large specific surface area; and chemical stability. These superb properties offer graphenes many potential applications ranging from nanoelectronics, composite materials, sensors to electrochemical electrodes in lithium ion batteries, solar cells, or ultracapacitors. Specific electronics applications of graphene include mobile phones, radars, transistors, data storage, touch screens, and wearable electronics.

Although there is an increasing interest in both the theoretical and experimental study of graphene, high quality, low cost, and scalable graphene production is still a major challenge. There are basically four methods of making graphene. The first method is the mechanical exfoliation of graphite, which can produce high quality graphene. However, the yield is low because it is hard to control the layers of graphene in the product. Therefore, this method is only useful for fundamental study. The second is chemically derived graphene colloidal suspensions. This method can produce scalable graphene sheets in solution, but the electrical conductivity is poor since the chemical oxidation and reduction process may lead to structural defects. The third method is organic synthesis. However, graphene produced by total organic synthesis has size limits due to insolubility of macromolecules and side reactions. Lastly, chemical vapor deposition (CVD) is a promising method for growing high quality and large-scale graphene. The existing CVD methods require expensive transition metals such as Co, Ni, Pt, Ir, and Ru as catalyst, hydrocarbon gas as carbon source, and e-beam evaporation process. Some CVD methods also need ultrahigh vacuum conditions and/or specific substrates for graphene growth. High costs hinder the use of the CVD methods for large-scale graphene production and applications.

SUMMARY OF THE INVENTION

The present invention is premised on the realization that graphene can be inexpensively produced using a coal byproduct. More particularly, the present invention is premised on the realization that char, which is the byproduct of electrolysis of an aqueous coal slurry, can be used to form graphene.

More particularly, ground coal can be subjected to electrolysis which will consume a portion of the coal, forming particles that are coated with a gelatinous organometallic material which prevents further electrolysis. These coated particles can be subjected to solvent extraction to remove the organic material, allowing the coal particles to be used again for electrolysis. This can be repeated until cleaning or solvent extraction of the coating no longer improves the efficacy of the coal particles in electrolysis.

The char, electrolyzed coal particles or the gelatinous coating can be used as a carbon source material to form graphene. This method can be used with a wide variety of different coals, and, further, the electrolyzed coal can be collected from the electrolysis process at any time, either after an initial electrolysis or after repeated electrolysis, depending on the end use requirements. Graphene is produced from electrolyzed coal by chemical vapor deposition at atmospheric pressure in the presence of hydrogen gas. This produces high quality graphene at a relatively low cost and without expensive catalysts.

The objects and advantages of the present invention will be further appreciated in light of the following detailed description and examples in which:

DETAILED DESCRIPTION

Figure 1:
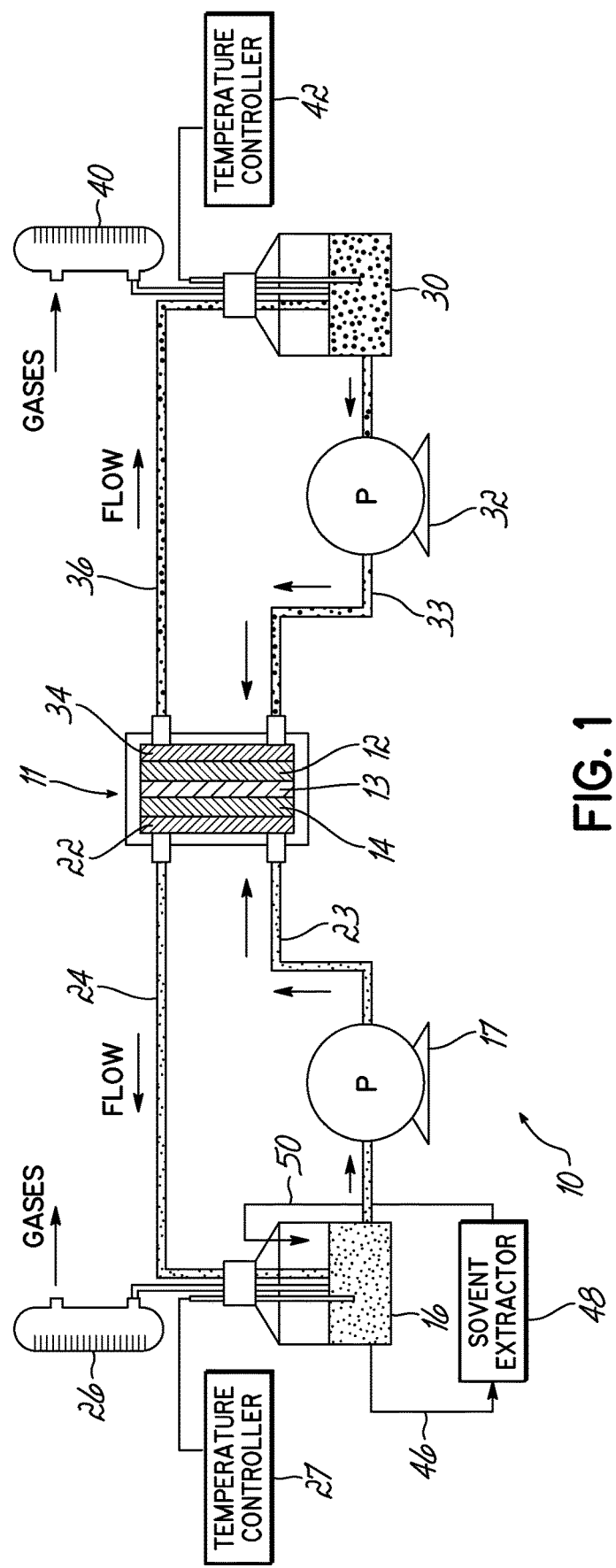
FIG. 1 is a diagrammatic depiction of an electrolytic apparatus to form hydrogen from coal slurries.

FIG. 1 shows a diagrammatic depiction of an apparatus 10 used to electrolyze coal which, in turn, produces char or electrolyzed coal particles for the manufacture of graphene. As shown in FIG. 1, the apparatus 10 includes an electrolytic cell 11, which incorporates a cathode 12 and an anode 14 separated by a membrane 13, such as a Nafion membrane or polyethylene membrane.

A reservoir 16, which contains the anode solution, leads to a pump 17, which pumps the anode solution into the anodic side of the electrolytic cell 11. As shown, the anode solution flows through line 23 through the channels 21 in an acrylic block 22. The anode fluid passes through the channels 21 and returns via line 24 to the reservoir 16. The generated gas, carbon dioxide, in the fluid is emitted from the reservoir and is directed to a gas collector 26. A temperature controller 27 is located in the reservoir 16.

At the opposite side, reservoir 30 includes the cathode solution, which is directed to pump 32 leading to the cathode side of electrolytic cell 11. Again, this cathode solution passes through line 33 through channels (not shown) in the acrylic block 34, which provide contact with the cathode 12, and the fluid then is directed from the channels through line 36 back to the reservoir 30. The generated gas, hydrogen, is directed to the gas collector 40. Again, a temperature controller 42 is located in reservoir 30.

Figure 2:
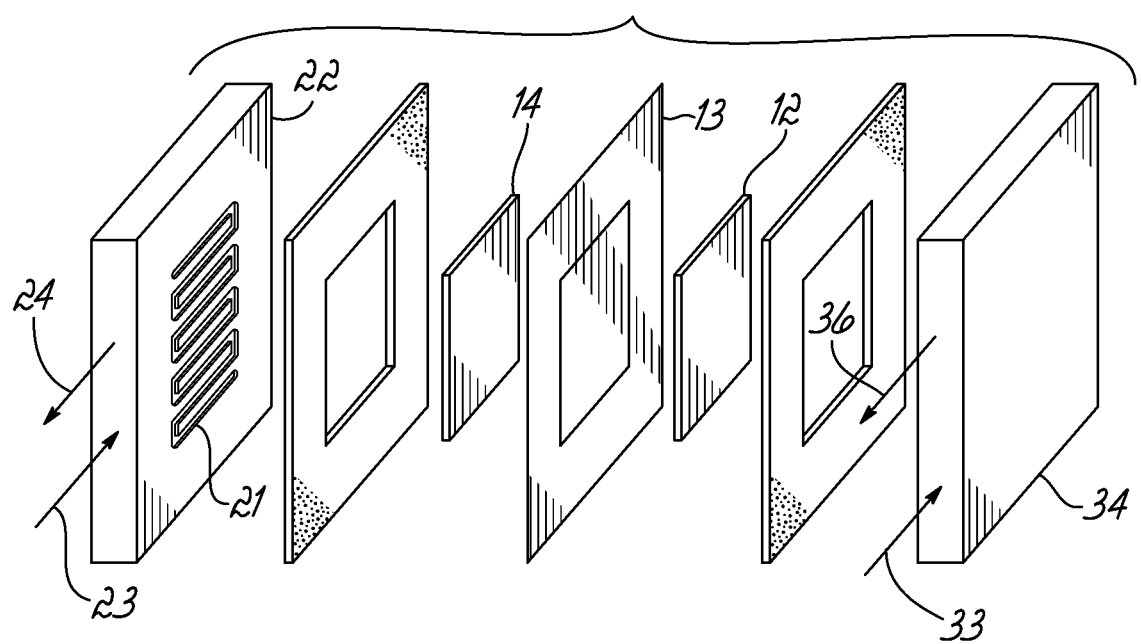
FIG. 2 is an exploded diagrammatic view of the electrolytic cell of FIG. 1.

FIG. 2 shows an exploded view of the electrolytic cell 11. Acrylic blocks 22 and 34 are mirror images of each other. The anode 14 and cathode 12 are on either side of the separator 13. Spacing is established between the acrylic blocks 22 and 34, the cathode 12, and the anode 14 by inert separators 44 and 46. These can be, for example, polytetrafluoroethylene, Nafion or polyethylene.

The cathode 12 can be any material which will withstand the acidic conditions in the electrolytic cell 11. These include carbon, nickel, and noble metals such as platinum, iridium, rhodium, and combinations thereof.

Although the anode 14 can be any conductor, the anode 14 typically comprises a noble metal-containing electrocatalyst electroplated, i.e., deposited, on a substrate or support. The electrocatalyst may be single metal, bi- or trimetallic, and comprise at least one noble metal and one or more other metals that are active to coal electrolysis. The other metals may be, but are not necessarily, noble metals. In some embodiments, the electrocatalyst may comprise a single noble metal on a support.

The support may be chosen from many known supports. Some suitable supports include noble metal meshes and foils, such as platinum mesh, platinum foil, titanium mesh, Hastelloy mesh, gold mesh, gold foil, tantalum mesh, tantalum foil, as well as platinum or iridium sponges. When mesh is used as the substrate, the mesh size will be chosen such that it can be properly electroplated with the electrocatalyst, whether it is a bi- or tri-metallic catalyst electroplated on the substrate, or a bi-or trimetallic/Raney metal catalyst electro deposited on the substrate. Aside from the specific substrates listed, other suitable supports will be recognized by those of ordinary skill in the art. In some embodiments, the electrode is a bi- or tri-metallic electrocatalyst electroplated directly on a support.

Suitable metals for bi- and tri-metallic catalysts are selected from platinum, iridium, ruthenium, rhenium, palladium, gold, silver, nickel, and iron. By way of example, in one embodiment, the electrode is a platinum-iridium electrocatalyst electrodeposited on platinum mesh.

The electrolysis of coal is further described in U.S. Pat. No. 7,736,475, the disclosure of which is incorporated herein by reference. The Application references coal as a fuel. Coal is intended to reference a carbon based product such a coal, charcoal lignites, or graphite.

To form char or electrolyzed coal, a coal slurry is prepared by grinding coal to a particle size between 1 μm to 249 μm. The pulverized coal is mixed with an electrolyte containing a proton carrier (e.g., $H_2SO_4$, $H_3PO_4$, etc.) and a catalytic salt (e.g., iron salt, or cerium salt). Typically, iron is required for an efficient reaction. The concentration of iron can be up to 10,000 ppm.

The current density which can be applied in the electrolytic process can be from 30 mA/cm$^2$ up to 200 mA/cm$^2$. It is preferred to use a current density of at least 90 mA/cm$^2$ or higher. The temperature which can be applied in the electrolytic process can be from 80° C. or higher. The coal slurry is introduced into the coal electrolytic cell as the anode solution. During the electrolysis, dehydrogenation of the coal takes place, producing pure hydrogen at the cathodic compartment of the electrolytic cell. Coal is oxidized to carbon dioxide (which is collected at the anodic compartment of the electrolytic cell) and large hydrocarbon structures, which coat the coal particles. After electrolysis, the electrolyzed char slurry is filtered to separate the electrolyte from the solids. The electrolyte and catalytic salts can be reused in the coal electrolytic cell.

The mechanism by which coal is electrolyzed is a multistep process. Fe (III) ions in solution are adsorbed on the surface of a coal particle. The adsorbed C—Fe (III)$_{ads}$ structure flows toward the surface of the electrode due to forced flow. The C—Fe (III)$_{ads}$ structure contacts the anode electrode, and Fe (III)$_{ads}$ on the coal acts as a bridge between the coal and the electrode. Due to steric effects and/or electrostatic charges, Fe (III) is de-adsorbed from the coal particle to the anode electrode, and then the oxidation of coal takes place, simultaneously reducing Fe (III) to Fe (II). During the process coal can be oxidized to $CO_2$ and/or other large chain hydrocarbons. The Fe (II) ions are oxidized at the anode of the electrolytic cell to regenerate Fe (III) ions. As coal oxidizes, gelatinous films grow on the surface of the coal particle, which ultimately prevent the oxidation of coal.

Thus, the coal slurry is passed through the apparatus 10 shown in FIG. 1 and repeatedly circulated back to the reservoir 16 and through the electrolytic cell 11. Eventually, the coal particles become coated with the gelatinous material, which prevents their further use in electrolysis. These particles can be then directed via line 44 to a solvent extractor 48 which contacts the coal particles with an organic solvent such as ethanol, isopropanol, pyridine, or acetone.

The solvent at elevated temperatures, if necessary, removes the gelatinous coating from the coal particles. The solvent is separated from the particles by filtration, and the particles can then be introduced back into the anode solution through line 49 and electrolyzed further. These steps can be repeated until the coal particles are no longer electrolyzed (i.e., until, the production of hydrogen is significantly reduced). At this point, the coal particles coated with the gelatinous coating can be used in the formation of graphene. Coal particles can be used for the formation of graphene at any cycle during the electrolysis; however, it is preferable to use this feedstock for graphene production when the hydrogen production significantly decreases.

Once it is determined that the coal particles should be used for formation of graphene, the coal particles are filtered to separate the electrolyte, which can then be reused. The particles with the gelatinous coating are then dried.

The graphene can be formed from the dried char, that is, the electrolyzed coal particles with the gelatinous film, from the gelatinous film, or from the particles without the gelatinous film. If formed from the particles coated with the gelatinous film, the char is simply separated from the electrolyte, as described above. This electrolyzed coal is then dried to evaporate the water, as described above, and coated onto a support or substrate 50, such as a copper film. The electrolyzed coal can be dispersed in a carrier such as liquid alcohols, alkenes, or tones, and sprayed onto the substrate 50. In an embodiment, a gas sprayer may be used to dispense the electrolyzed coal onto the substrate 50. The carrier is then evaporated. Alternatively, the dried, ground particles can be applied as a thin coating onto the substrate 50. It is preferable to obtain a very thin coating of the electrolyzed coal in the substrate 50. Using the carrier to disperse the electrolyzed coal on the substrate facilitates this.

In a second method, the gelatinous material, which has been separated from the electrolyzed coal particles, is concentrated by removing extraction solvents. This produces a thick carbonaceous syrup, which is then coated onto the substrate 50. This can be applied, again, with a carrier, which is subsequently evaporated, or directly applied onto the substrate 50.

In a third method, the electrolyzed coal particles separated from the gelatinous material can also be used as the carbon source for the formation of graphene. When utilizing this embodiment, the electrolyzed coal is separated from the electrolyte and dried. The gelatinous material is removed, leaving the dried electrolyzed coal particles. These particles may be dispersed in a carrier and sonicated to disperse the particles in the solution. The particles can then be sprayed onto the substrate 50 and dried. Alternatively, the dried, ground, particles can be applied as a thin coating onto the substrate 50. Again, with all of these embodiments it is preferable to have as thin a coating as possible on the substrate 50 in order to facilitate production of graphene.

Prior to deposition of the electrolyzed coal, the substrate 50 can be rinsed with acetone or isopropanol (IPA) and sonicated for a period of time, for example, 10-15 minutes.

Then, the substrate 50 may further be pre-heated in a furnace to a temperature of about 800° C. for 30 minutes.

Figure 3:
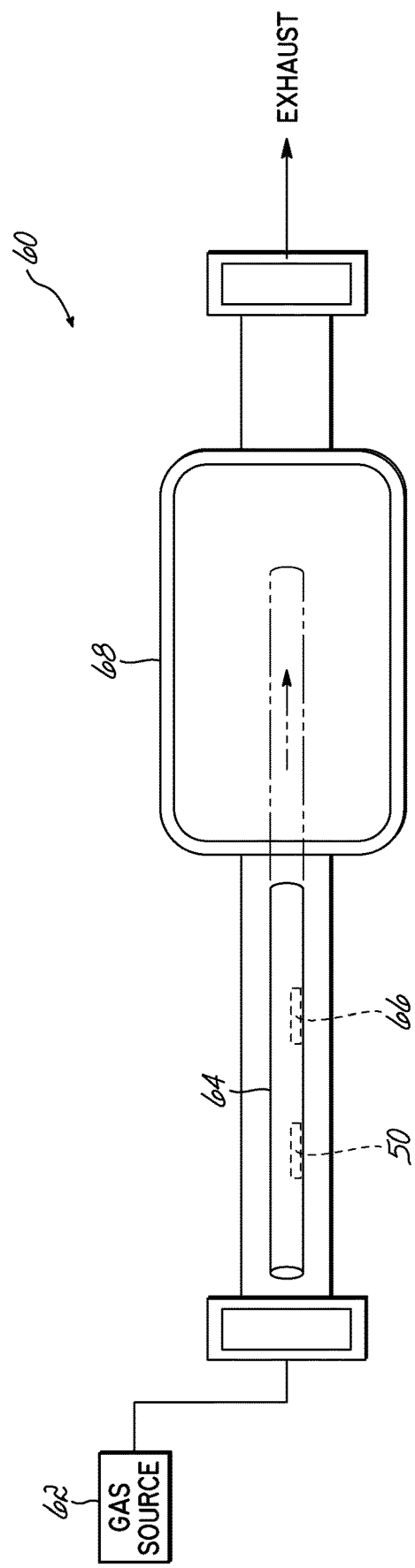
FIG. 3 is a diagrammatic depiction of an apparatus used to form graphene.

FIG. 3 shows a diagrammatic depiction of the apparatus 60 used to produce graphene. As shown, this apparatus 60 includes a gas source 62. The gas source 26 may include, for example, hydrogen and an inert carrier such as argon. The gas is introduced into a quartz tube heating element 64, which contains the substrate 50, such as copper foils, coated with the electrolyzed coal product. Also located in the quartz tube 64 is an uncoated substrate or surface 66 on which the graphene will be produced. The surface 66 for supporting nanostructure synthesis may be a copper foil, a silicon wafer, or any other material that can withstand reaction conditions. The quartz tube 64 is inserted into the heating zone of a tube furnace 68 where the graphene formation takes place.

The graphene is then formed by flowing a reductant gas over the coated substrate 50 at elevated temperatures using chemical vapor deposition. Any commercially available chemical vapor deposition apparatus is suitable, and the graphene formation can be conducted at atmospheric pressure.

Higher temperatures facilitate the production of graphene. At lower temperatures, such as about 400° C., a carbon film is produced which is not graphene. Accordingly, it is preferred to use higher temperatures, at least 490° C. or higher, up to about 1100° C. Higher temperatures, such as 700 to 1000° C. can also be used, and, typically, 800 to 1000° C. will be utilized. These temperatures cause graphite production in the presence of reductant gas. A flowing stream of reductant gas deposits graphene onto the surface 66.

With the electrolyzed coal on substrate 50, an inert gas such as argon is introduced through the apparatus 60 at a rate of, for example, 600 SCCM to purge the system of any reactive gases. The duration of this purge may last, for example, 20 minutes. Then, over a period of, for example, 40 minutes, the temperature in the furnace is increased to reaction conditions, typically 800° C. A reductant gas, in particular hydrogen, is then introduced into the system along with the argon, typically at 600 SCCM of argon with 100 SCCM of hydrogen. The exact ratio of the gases is not critical. During this time, graphene growth occurs. The grapheme growth period can be continued as long as necessary. Typically, the time can be from a few minutes to an hour or more. As an example, the graphene growth period may have a duration of 30 minutes. When desired, the reaction is stopped by discontinuing the introduction of the hydrogen and cooling the furnace 68 rapidly to room temperature. The manufacture of graphene from electrolyzed coal will be further appreciated in light of the following examples, 1-5.

EXAMPLE 1

In one example, a slurry having coal particles of approximately 44 μm were suspended in a concentration of approximately 0.04 g/ml. The slurry had an iron concentration of approximately 40 mM. The coal slurry was electrolyzed at a temperature of 104° C. and with a current of 100 mA/cm$^2$.

After the electrolysis cycle was repeated several times, the electrolyzed coal particles were used for graphene synthesis. A copper foil having dimensions of approximately 2 cm×1 cm was pre-treated with an acetone rinse. Approximately 10 mg of electrolyzed coal was then deposited on the copper foil. The copper foil having the electrolyzed coal deposited thereon, as well as a clean copper foil (i.e., having no electrolyzed coal deposited thereon) were positioned inside a ¼ in. diameter quartz tube. The quartz tube was then moved inside of a furnace.

600 SCCM argon flowed over the wafer for 20 minutes to create an inert atmosphere. The furnace was them ramped up to 1000° C. in 40 minutes with a 600 SCCM argon and 100 SCCM hydrogen flow. The 1000° C. temperature was maintained for 30 minutes, during which graphene growth occurred. The wafer was then cooled down by moving out of the furnace. The wafer initially experienced rapid cool down and was fully cooled to room temperature over a period of 3 hours, during which time the argon-hydrogen flow continued to flow over the wafer.

Following the graphene growth cycle and cool down, the copper foil on which the electrolyzed coal had been deposited was placed in Marble's reagent, which dissolved the copper foil. At this point, a graphene film was left floating in the reagent, and the film was then transferred to a titanium foil. Raman spectroscopy of the graphene film showed significantly fewer defects than regular coal. A selected area electron diffraction (SAED) pattern showed a hexagonal lattice structure of the single crystal graphene.

EXAMPLE 2

In another example, a silicon wafer was pre-treated, and IPA was deposited on the wafer rather than electrolyzed coal. The wafer was placed in the furnace, and argon was purged at 1 SLPM for 20 minutes. The furnace was then ramped up to 800° C. in 30 minutes with an argon flow. The 800° C. temperature was maintained for 30 minutes with a hydrogen-nitrogen flow at 0.8 SLPM. The system was then cooled down to room temperature under 1 SLPM of argon flow.

In this example, no graphene synthesized on the wafer. This example suggests that IPA by itself does not contribute to the graphene synthesis.

EXAMPLE 3

In yet another example, a slurry having coal particles of approximately 210-249 μm suspended in a concentration of approximately 0.04 g/ml was made. The slurry had an iron concentration of approximately 40 mM. The coal slurry was electrolyzed at a temperature of 104° C. and with a current of 100 mA/cm$^2$. The resulting electrolyzed coal was then used for graphene synthesis.

For one substrate, approximately 6 mg of the electrolyzed coal was diluted in 6 ml IPA. The solution was sonicated for 5 minutes. The solution was then diluted 30 times using IPA and sonicated again. 25 ml of the solution was deposited on a silicon wafer, and the IPA was allowed to evaporate. This same pre-treatment process was also used to prepare a second silicon wafer substrate on which raw coal particles in the range of 210-249 μm were deposited.

In separate reactions, the wafer with electrolyzed coal and the wafer with raw coal were moved into the furnace. Each wafer was purged with argon at 1 SLPM for 20 minutes. For each wafer, the furnace was ramped up to 800° C. with a flow of a hydrogen-nitrogen mixture at 0.8 SLPM for 30 minutes. The system was then cooled down to room temperature under an argon flow of 1 SLPM.

A comparison of the two treated wafers showed that graphene synthesized on the wafer with electrolyzed coal. On the other hand, while nanostructures grew on the wafer having raw coal, the nanostructure topography was different than the expected topography for graphene. Therefore, this example suggests that raw coal alone by itself does not contribute to graphene synthesis.

EXAMPLE 4

In yet another example, synthesis was performed with samples of coal that were electrolyzed in different conditions, as well as with raw coal. Those conditions are summarized in Table 1.

TABLE 1

|  | Sample A | Sample B | Sample C | Raw Coal |
|---|---|---|---|---|
| Temperature (° C.) | 80 | 104 | 104 | — |
| Particle size (μm) | 44 | 44 | 44 | 44 |
| Coal concentration (g/ml) | 0.04 | 0.04 | 0.04 | — |
| Iron concentration (mM) | 40 | 40 | 40 | — |
| Current density (mA/cm$^2$) | 30 | 30 | 100 | — |

For each sample, a slurry was prepared with 6 mg of coal in 6 ml of IPA. The solution was then sonicated for 5 minutes. The slurry was then diluted 20 times using IPA and sonicated again. For each sample, 25 ml of the slurry was then deposited on a silicon wafer, and the solvent was allowed to evaporate.

Each wafer was moved to the furnace. The wafers were purged with argon at 1 SLPM for 20 minutes. The furnace was then ramped up to 800° C. with argon flow for 30 minutes. The furnace was then maintained for 30 minutes at 800° C. with a flow of a hydrogen-nitrogen mixture at 0.8 SLPM. The system was then cooled down to room temperature with an argon flow of 1 SLPM.

As in Example 3 above, nanostructures grew from the wafer having raw coal, but the topography of the nanostructures did not follow the expected topography for graphene. The wafers with samples A-C had nanostructure growth exhibiting the topography of graphene. Sample C yielded the greatest amount of nanostructure growth, and sample A yielded the least amount of nanostructure growth. Accordingly, this example suggests that coal electrolyzed at a higher temperature (specifically, 104° C. vs. 80° C.) yields greater graphene synthesis, and that coal electrolyzed at a higher current density (specifically, 100 mA/cm$^2$ vs. 30 mA/cm$^2$) yields greater graphene synthesis.

EXAMPLE 5

In still another example, a slurry was prepared with 5.8 mg of electrolyzed coal in 6 ml isopropanol. The slurry was sonicated 5 minutes, and then diluted 20 times. A silicon wafer was cleaned with acetone and D-water, and then 100 μl of the slurry was deposited on the wafer. This same pre-treatment process was also used to prepare a second silicon wafer on which raw coal particles were deposited.

After drying, the wafers were positioned in the center of a quartz tube. The wafers were purged with 1000 SCCM of argon for 20 minutes. The furnace was then ramped up to 800° C. with a 1000 SCCM argon flow for 30 minutes. The temperature of the system was then held at 800° C. for additional 30 minutes with a 100 SCCM hydrogen-nitrogen flow (1:9). The system as then cooled down to room temperature under a 1000 SCCM argon flow.

An atomic force microscopy (AFM) image of the graphene sheets was taken under ambient conditions using a MFP-3D microscope (Asylum Research, Santa Barbara, Calif.) in AC mode. The AFM height image and 3D image showed the morphology of graphene sheets. The images and height measurement showed that the thickness was ~1 nm, indicating that the two-dimensional sheets were graphene monolayers. Large scale scanning showed that the lateral dimensions of the graphenes were up to a few hundred nanometers.

These Examples demonstrate that electrolyzed coal undergoes decomposition and graphenization at high temperatures. The hydrogen acts as both a reducing gas and a carrier gas, reacting with the graphatized coal at high temperatures to generate the hydrocarbons or other reactive intermediates. These hydrocarbons and reactive intermediates act as precursors for the synthesis of graphene on copper foil. This method is particularly effective and should significantly reduce the cost of forming high quality graphene for commercial use.

This has been a description of the present invention along with preferred methods of practicing the present invention. However, the invention itself should only be defined by the appended claims.

What is claimed is:

1. A method of forming graphene comprising heating electrolyzed coal to a temperature effective to form graphite in the presence of a flowing stream of reductant gas, said temperature being greater than 400° centigrade and less than 1100° centigrade, wherein the stream of reductant gas deposits graphene onto a surface forming a graphene sheet.

2. The method claimed in claim 1 wherein said electrolyzed coal is deposited as a thin layer onto a substrate and said reductant gas is passed at elevated temperatures over said thin layer.

3. The method claimed in claim 2 wherein said electrolyzed coal comprises a gelatinous material formed on electrolyzed coal particles.

4. The method claimed in claim 2 wherein said electrolyzed coal comprises electrolyzed coal particles coated with a gelatinous film which is formed during the electrolysis process.

5. The method claimed in claim 4 the depositing of the electrolyzed coal onto the substrate further comprising dispersing the electrolyzed coal in a carrier, using a gas sprayer to dispense the electrolyzed coal in the carrier onto the substrate, and evaporating the carrier.

6. The method claimed in claim 2 wherein said electrolyzed coal comprises electrolyzed coal particles.

7. The method claimed in claim 6 the depositing of the electrolyzed coal onto the substrate further comprising dispersing the electrolyzed coal in a carrier, using a gas sprayer to dispense the electrolyzed coal in the carrier onto the substrate, and evaporating the carrier.

8. The method claimed in claim 2 wherein said reductant gas comprises hydrogen and an inert carrier gas.

9. The method claimed in claim 8 wherein said reductant gas comprises hydrogen and nitrogen.

10. The method claimed in claim 9 wherein the reductant gas flows at a rate of 0.8 SLPM.

11. The method claimed in claim 2 wherein the substrate comprises copper foil.

12. The method claimed in claim 1 wherein said temperature is greater than 490° centigrade.

13. The method claimed in claim 12 wherein said temperature is greater than 700° centigrade and less than 1000° centigrade.

14. The method claimed in claim 1 further comprising flowing a stream of an inert gas prior to the flowing of the stream of reductant gas.

15. The method claimed in claim 14 wherein the inert gas is argon.

16. The method claimed in claim 1 further comprising rapidly cooling the surface subsequent to the heating step.

17. The method claimed in claim 1 wherein the surface comprises copper foil.

18. The method claimed in claim 1 wherein the electrolyzed coal has been electrolyzed at a current density greater than 30 mA/cm2 and less than 200 mA/cm2.

19. The method claimed in claim 18 wherein the electrolyzed coal has been electrolyzed at a current density greater than 90 mA/cm2.

20. The method claimed in claim 1 wherein the electrolyzed coal has been electrolyzed at a temperature equal to or greater than 80° centigrade.

* * * * *